(12) United States Patent
Takeshita et al.

(10) Patent No.: US 8,021,202 B2
(45) Date of Patent: Sep. 20, 2011

(54) METHOD OF MANUFACTURING AN ORGANIC EL DISPLAY PANEL

(75) Inventors: Koji Takeshita, Tokyo (JP); Takahisa Shimizu, Tokyo (JP); Syohei Kimura, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 139 days.

(21) Appl. No.: 12/482,361

(22) Filed: Jun. 10, 2009

(65) Prior Publication Data

US 2010/0079063 A1    Apr. 1, 2010

(30) Foreign Application Priority Data

Sep. 30, 2008    (JP) ................................. 2008-254246

(51) Int. Cl.
*H01J 9/00*    (2006.01)

(52) U.S. Cl. ........................................................ 445/23
(58) Field of Classification Search .................. 313/634, 313/635, 573, 493; 445/23–25
See application file for complete search history.

(56) References Cited

FOREIGN PATENT DOCUMENTS

| JP | 2001-093668 | 4/2001 |
| JP | 2001-155858 | 6/2001 |

*Primary Examiner* — Joseph L Williams
(74) *Attorney, Agent, or Firm* — Squire, Sanders & Dempsey (US) LLP

(57) ABSTRACT

One embodiment of the present invention is a method for manufacturing an organic EL display panel in which a substrate which has a pixel electrode, a partition wall, a sub pixel which has a short side and a long side sectioned by the partition wall and a pixel including a plurality of the sub pixels are prepared and a first organic layer is formed and printed so as to form a stripe shape in the short side direction of the sub pixel and a second organic layer as a luminescent layer is formed on the sub pixel.

7 Claims, 3 Drawing Sheets

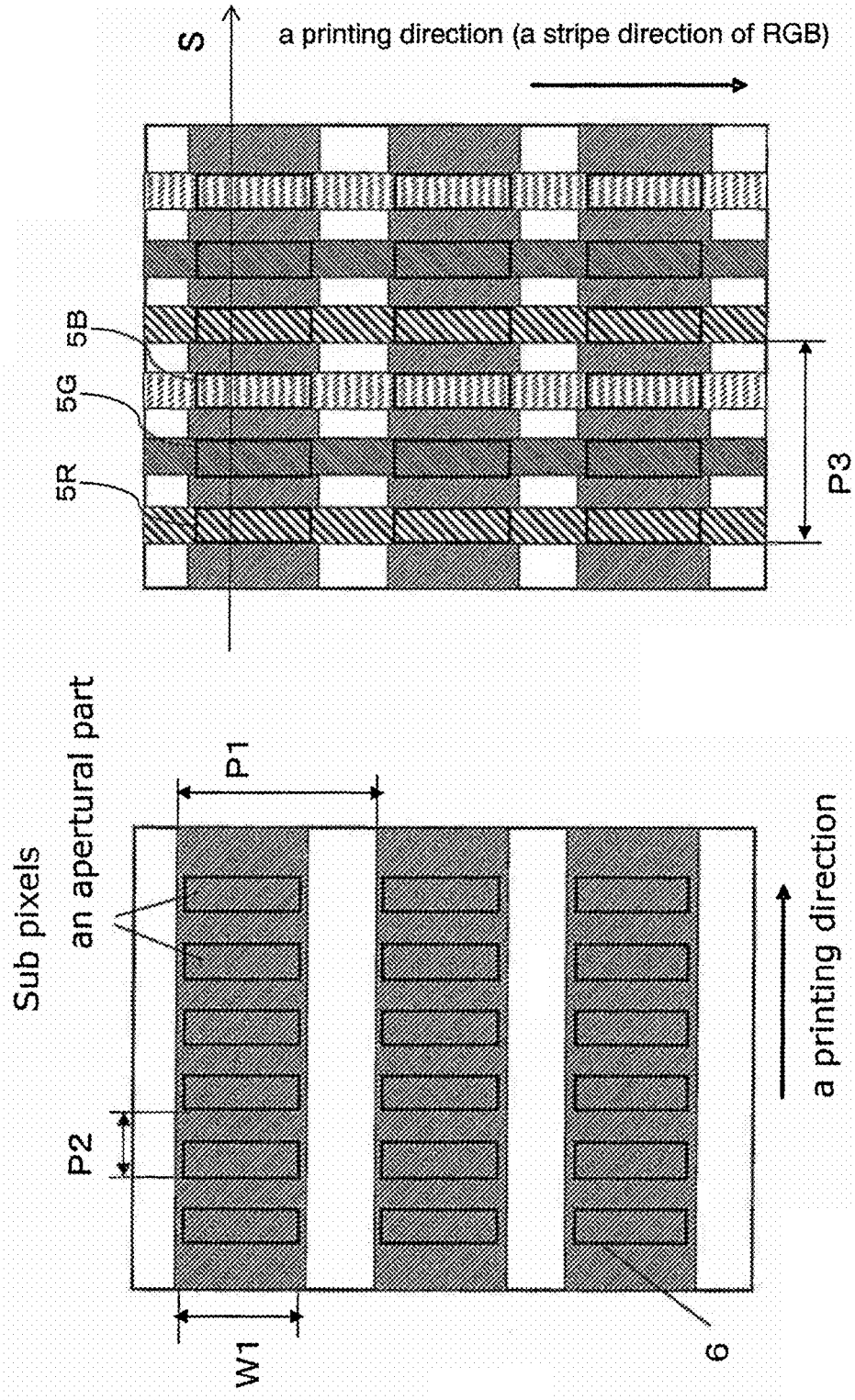

METHOD OF MANUFACTURING AN ORGANIC EL DISPLAY PANEL

CROSS REFERENCE TO RELATED APPLICATION

This application is based on and claims the benefit of priority from the Japanese Patent Application number 2008-254246, filed on Sep. 30, 2008; the entire contents of which are incorporated herein by reference.

BACKGROUND OF THE INVENTION

1. Field of the Invention

The present invention relates to an organic electroluminescence element (heretofore referred to as an organic EL element). In particular, the present invention relates to a display panel which uses an organic EL element where at least one organic layer is formed by a relief printing method.

2. Description of the Related Art

An organic EL element emits light by applying electrical current to a luminescent layer made of an organic luminescence material which is formed between two electrodes facing each other. The film thickness of a luminescent layer is important so that an organic EL element may emit light efficiently. Therefore, the film is required to be a thin film with a thickness of about 100 nm. In addition, patterning with a high definition is necessary in order to use an organic EL element as a display in which colors are separated by luminescent colors, such as, R (red), G (green) and B (blue).

As an organic luminescence material which forms a luminescent layer, a low-molecular material and a high-molecular material can be used. In general, a thin film of a low-molecular material is formed by a resistance heating evaporation method or the like, and in this case, patterning is performed by using a mask which has a fine pattern. However, there was a problem that the larger a substrate became, the more difficult it became to obtain patterning accuracy.

Then, recently, a method for forming a thin film by a wet coating method with a coating liquid which is made by dissolving a high-molecular material in a solvent has been practiced. As a wet coating method of forming a thin film, a spin coating method, a bar coat method, an extrusion coat method and a dip coat method are examples. However, it is difficult to pattern with a high definition and form three colors, that is, R, G and B, separately by these wet coating methods. Therefore, it is thought that a formation of a thin film by a printing method which is superior in application of different colors and patterning is the most efficient. Actually, as a practice by a printing method, a method performed by an offset printing method (Patent Document 1) and a method performed by a relief printing method (Patent Document 2) have been proposed.

As a basic structure of a high-molecular organic EL element which uses a high-molecular material as an organic luminescence material, a structure in which a luminescent medium layer such as a hole transport layer, an interlayer, a luminescent layer or an electron injection layer are stacked respectively between an anode and a cathode is used generally. Among the above, a layer having an organic compound is called an organic layer in the present invention.

An interlayer which is formed as a buffer layer between a hole transport layer and a luminescent layer in this luminescent medium layer is expected to have an effect of enhancing hole transport properties and an effect of blocking an electron coming from a cathode side. Actually, the fact that efficiency and lifetime of an organic EL element are improved by forming an interlayer has been confirmed.

A high-molecular material which is used for an interlayer can be dissolved in an organic solvent and can be made into a coating liquid the same as a material which forms a luminescent layer. Therefore, the thin film of the interlayer can be formed by a wet coating method. In addition, a display panel can be manufactured by a method of applying an interlayer to an entire surface of a substrate in one go such as a spin coating method, a bar coat method, an extrusion coat method and a dip coat method, because a separate application for three colors of RGB is not required for forming an interlayer, though it is required for forming a luminescent layer.

However, in an actual substrate of a panel for a display, there are some parts which have a problem, when an organic layer is applied. For example, a connection wiring portion which is for connecting to an electrode and a part which is for connecting to a driver for driving. Therefore, when an organic layer is applied to an entire surface of a substrate, it is necessary to remove an unnecessary part of the organic layer.

Moreover, since a luminescent layer is formed on the interlayer, a condition of a film formation of a luminescent layer changes depending on a condition of a film formation of the interlayer. In other words, if a film of an interlayer is formed nonuniformly, a film of a luminescent layer is formed nonuniformly due to unevenness such as surface asperity and a difference in wetting properties. Therefore, emission irregularity occurs.

Thus, a purpose of the present invention is to provide an organic EL display panel and a method of manufacturing an organic EL display panel in which emission irregularity is decreased by improving evenness of a film thickness of particularly an interlayer which is one of the organic layers formed by a wet coating method.

Patent Document 1: JP-A-2001-93668
Patent Document 2: JP-A-2001-155858

SUMMARY OF THE INVENTION

One embodiment of the present invention is a method for manufacturing an organic EL display panel in which a substrate which has a pixel electrode, a partition wall, a sub pixel which has a short side and a long side sectioned by the partition wall and a pixel including a plurality of the sub pixels are prepared and a first organic layer is formed and printed so as to form a stripe shape in the short side direction of the sub pixel and a second organic layer as a luminescent layer is formed on the sub pixel.

BRIEF DESCRIPTION OF THE DRAWINGS

FIG. 2 is a pattern diagram of a substrate on which an interlayer is formed

FIG. 3 is a pattern diagram of a substrate on which a luminescent layer is formed

DETAILED DESCRIPTION OF THE INVENTION

An embodiment of the present invention is explained by exemplifying a case of manufacturing an organic EL display panel of an active matrix type which uses a TFT substrate. As a TFT substrate which is used for manufacturing a panel, a substrate on which a sub pixel electrode, a TFT circuit, an insulating layer or the like have already been formed is used. In addition, an embodiment of the present invention is explained as an example in which a partition wall, an organic layer, a cathode and a sealing layer are formed on the substrate. However, the present invention is not limited to this example. For example, the present invention is also applicable to an organic EL display panel of a passive matrix type.

Figures 1, 4:
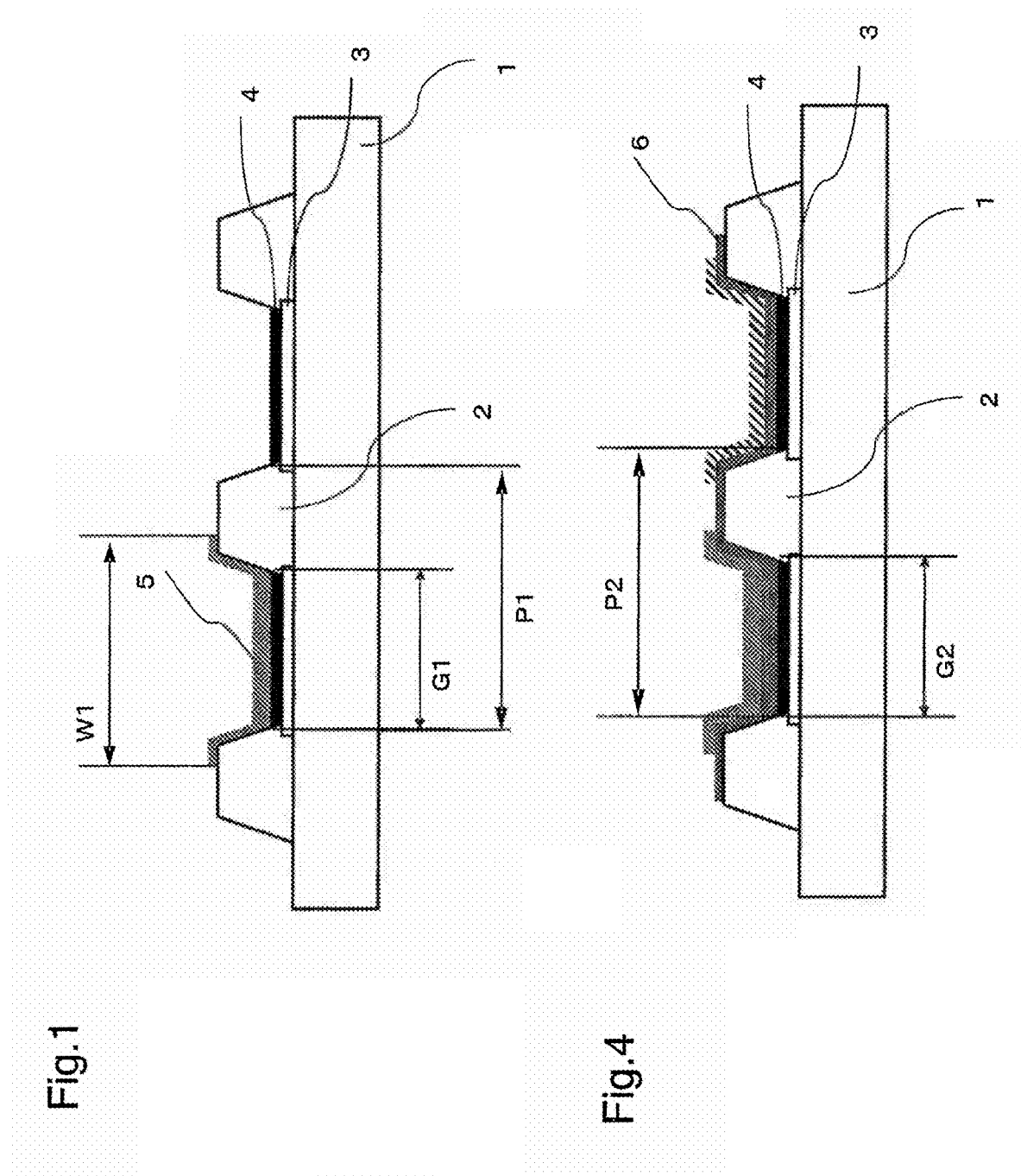
FIG. 1 is a cross sectional diagram of an organic EL element in the manufacturing process of the present invention.
FIG. 4 is a cross sectional diagram of an organic EL element of the present invention.

FIG. 1 is a cross sectional diagram in a long side direction of an organic EL element in the manufacturing process of the present invention. Respective sub pixels on a substrate 1 are sectioned by a partition wall 2 having an insulating material such as polyimide. Therefore, the substrate has an independent aperture part of the matrix type on a sub pixel electrode 3. Moreover, a sub pixel electrode is connected to a TFT. However, this is omitted from the diagram. An organic layer including a luminescent layer 5 is formed on respective sub pixels. A luminescent layer is formed on respective sub pixels depending on a luminescent color. As a luminescent color, a structure in which one pixel has sub pixels having three colors, R (red), G (green) and B (blue) is general. However, the structure is not limited to this. As a luminescent medium layer except for a luminescent layer, a hole transport layer, an interlayer and an electron injection layer can be included arbitrary. In the present invention, an organic EL element has at least a luminescent layer and a film of an organic layer formed before a luminescent layer is formed. A method of manufacturing an organic EL display panel of the present invention is explained below step by step. A luminescent medium layer having a hole transport layer, an interlayer and a luminescent layer which corresponds to three colors, R, G and B is exemplified in the explanation. However, a structure of an organic EL display panel is not limited to this example. An interlayer is explained below as an example of an organic layer formed by a printing method other than a luminescent layer. However, a method for manufacturing an organic EL display panel of the present invention can apply to a layer formed by an application method as long as the layer does not require a separate application.

A Method of Manufacturing an Organic EL Display Panel

First, a hole transport layer 4 is formed on a substrate 1 in which a sub pixel electrode 3 and a partition wall 2 have been formed. For a hole transport material which forms a hole transport layer, polyaniline derivative, polythiophene derivative, polyvinyl carbazole (PVK) derivative, poly(3,4-ethylenedioxythiophene) (PEDOT) or the like can be used. A hole transport material ink can be made by dissolving or dispersing one of these materials in a solvent. In addition, a thin film can be formed on an entire surface of a substrate 1 by a spin coating method. As a hole transport layer of an inorganic material, metal oxide such as $Cu_2O$, $Cr_2O_3$, $Mn_2O_3$, FeO, $Fe_2O_3$, $Fe_3O_4$, NiO, CoO, $Pr_2O_3$, $Ag_2O$, $MoO_2$, $Bi_2O_3$, ZnO, $TiO_2$, $SnO_2$, $ThO_2$, $V_2O_5$, $Nb_2O_5$, $Ta_2O_5$, $MoO_3$, $WO_3$ or $MnO_3$ can be formed by a vacuum evaporation method or a sputtering method.

Next, an interlayer is formed. As a material which forms an interlayer, an ink which is made by dissolving a commercially available interlayer material for a high-molecular organic EL element in an organic solvent is used. For an organic solvent which is used for making an ink, toluene, xylene, anisole, methyl anisole, tetralin or the like can be used. The above-mentioned solvents may be used either as a single solvent or as a mixed solvent.

In the case where an interlayer is formed by printing, a separate application for different colors depending on sub pixels is not required for the interlayer although it is required for a luminescent layer. As explained in the background of the art, the interlayer may be printed on an entire surface of a luminescent area part of a display, as long as a pattern-printing which can print the interlayer only on a necessary part within a substrate can be performed. However, it is difficult to apply the interlayer only to an entire surface of a luminescent area part by various wet coating methods. On the other hand, in the case where the interlayer is applied to an apertural part (a sub pixel) of a partition wall respectively, there is a problem that displacement and irregularity of a film thickness may occur, because the higher a definition of sub pixels becomes, the higher patterning-accuracy is required as described later.

Thus, the inventors of the present application found that by forming an organic layer such as an interlayer which is applied and formed, to form a pattern of a stripe shape by a printing method, irregularity of the film thickness of the organic layer could be eliminated. Furthermore, irregularity of the film thickness of the organic layer stacked thereon could also be eliminated FIG. 2 is a pattern diagram of a substrate on which an interlayer 6 is formed in a stripe shape. A partition wall 2 and an apertural area (a sub pixel) sectioned by the partition wall 2 are arranged on the substrate. The sub pixel is a rectangle shape which has a long side and a short side. This is because one pixel has a plurality of sub pixels (for example, three colors of RGB) in a short side direction. Therefore, a luminescent layer which is mentioned later has a structure in which a luminescent layer corresponding to respective luminescent colors is formed step by step in a short side direction.

It is difficult to manufacture a display with a high definition, when an organic layer, for example an interlayer, which is formed in a stripe shape on sub pixels is formed corresponding to rows of sub pixels of a long side direction of sub pixels. Therefore, an organic layer is preferably formed corresponding to rows of sub pixels of a short side direction of sub pixels. An organic layer can be formed in one go corresponding to respective rows of sub pixels by printing a pattern of a plurality of stripes. An organic layer having excellent film uniformity can be manufactured by this method, compared with a solid printing such as a roll coating method.

When an organic layer is formed corresponding to rows of sub pixels of a long side direction, a definition of a display is determined by a pitch P2. Therefore, in order to obtain a display with a high definition, it is necessary to make the pitch P2 narrow. However, when the pitch P2 is narrow, it is difficult to obtain a uniform pattern, because patterning with a high definition is required. According to the inspections which the inventors of the present invention performed, in the case where a luminescent layer is printed into a stripe shape corresponding to respective sub pixels of RGB, a limit of a printable pixel definition is 200 ppi. This indicates that, in the case of an organic layer in which a separate application of different colors is not required, when an organic layer is printed so as to obtain a pattern in rows of sub pixels of a long side direction, a sub pixel definition with which all sub pixels can be printed in one go is determined by a pitch P2, and that is about 200 ppi. Therefore, a printable pixel definition in a display having RGB colors is about 60 ppi, because a pixel definition is one third of a sub pixel definition. When a display with a higher definition of more than 60 ppi is manufactured, printing irregularities becomes larger, the same as in a solid printing, because ink spreads into a part which is not a transcriptional region. Therefore, defects in printing may occur. Then, when an organic layer is formed in a long side direction, it is difficult to manufacture a display with a definition more than 60 ppi.

On the other hand, when an organic layer is formed corresponding to rows of sub pixels of a short side direction, an organic layer can be printed with a pitch P1 which is larger than the pitch P2. Therefore, a display with a higher definition can be manufactured. For example, when a pixel is square, a display with a definition which is three times higher than that in the case where an organic layer is printed in a long side direction can be formed.

After the interlayer is formed, a luminescent layer 5 is formed. FIG. 3 is a pattern diagram of a substrate on which a luminescent layer 5 is formed. 5R, 5G and 5B corresponding to R, G, and B are formed in a stripe shape in a long side direction of rows of sub pixels in order. As the formation of a luminescent layer which is pattern-formed, a stripe shape which corresponds to rows of sub pixels as shown in FIG. 3 or a dot shape which corresponds to sub pixels can be used. However, if the formation is a stripe shape, an adjustment of a long side direction is easy. Therefore, the stripe shape is preferable. The luminescent layer can be formed by a wet coating method and preferably by a printing method. Moreover, in particular, the luminescent layer as well as the interlayer can be preferably formed by a relief printing method. As long as a printing width W1 of an interlayer at the time of formation is equal to or more than a width G1 of a long side direction of a luminescent area and equal to or less than a pitch P1 of a sub pixel, an interlayer may be connected to an adjacent interlayer on a partition wall 2. However, a width of a transcriptional region (a width of a convex part of a relief plate) on a plate at the time of printing is preferable to be a width where an ink exists independently without connecting to an adjacent transcriptional region, because a defect in printing may occur when a pitch is narrow as mentioned above. Even in this case, an interlayer is connected to an adjacent layer in some cases, because an ink is pushed up on a partition wall when a relief plate is used.

As an organic luminescence material which forms a luminescent layer, for example, a material in which a coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in a high-molecular material such as polystyrene, polymethyl methacrylate and polyvinyl carbazole, and a high-molecular material such as a polyarylene system, polyarylene vinylene system and polyolefin system can be used. An organic luminescent ink can be made by dissolving or dispersing the organic luminescence material in a solvent. As the same in the case of the above mentioned interlayer ink, a single organic solvent or a mixed solvent thereof can be exemplified as a solvent in which an organic luminescence material is dissolved or dispersed.

A cathode is formed after an organic luminescent layer is formed. As a material for a cathode, a material which corresponds to luminescent properties of an organic luminescent layer can be used. For example, metals such as lithium, magnesium, calcium, ytterbium or aluminum and alloy of the above mentioned material and a stable metal such as gold or silver can be exemplified. In addition, conductive oxide of indium, zinic or tin can also be used. As a method of forming a cathode layer, a method of forming a cathode by a vacuum evaporation method using a mask can be exemplified.

Lastly, these organic EL formatios are sealed by a glass cap and an adhesive in order to protect against external oxygen and moisture. Then, an element panel for an organic El display can be obtained.

A Structure of an Organic EL Display Panel

FIG. 4 is a cross sectional view of an organic EL display panel of the present invention along line S of the substrate of FIG. 3. The interlayer 6 has a continuous structure within sub pixels and on partition walls, because the interlayer 6 is formed in a stripe shape in a short side direction of a sub pixel. The luminescent layer 5 is formed on the interlayer 6. The luminescent layer 5 is formed by applying different colors separately to respective sub pixels. However, the luminescent layer 5 may slightly cover the partition wall 2 as shown in FIG. 4.

According to the structure of the present invention, the following effect can be obtained. Surface wetting properties of an area on which a luminescent layer is formed are uniform, because a layer arranged under the luminescent layer is formed so as to straddle sub pixels and partition walls in a long side direction of a sub pixel. Therefore, uniformity of a film thickness of the luminescent layer is improved.

A Method of Printing an Organic Layer

As a printing method of forming a luminescent layer and an interlayer on a substrate, a method such as a gravure printing which uses a hard plate such as a printing plate made of a metal or the like is not appropriate. An offset printing method which uses a blanket made of rubber having elasticity and a relief printing method which uses a rubber plate having elasticity likewise or a resin plate are appropriate. Therefore, a printing method by which a pattern-application can be performed is preferable in the case of making a display, because a part where an interlayer is applied can be selected by the pattern-application.

A high-molecular organic luminescence material and a high-molecular interlayer material have low solubility in a solvent such as water and alcohol. Therefore, in the case of making a coating liquid (heretofore referred to as an ink), it is necessary to dissolve or disperse the above materials in an organic solvent. In particular, an organic solvent such as toluene or xylene is preferable. Therefore, an ink of an organic luminescence material and an interlayer material (heretofore referred to as an organic EL ink) are inks having an organic solvent. However, there is a problem that a blanket made of a rubber which is used in an offset printing easily expands and is transformed by an organic solvent. Although there are various kinds of rubbers which are used for a blanket from an olefinic rubber to a silicon rubber, none of these rubbers have a resistance to toluene, xylene and other solvents. Therefore, because a rubber easily expands and is transformed, a rubber is not appropriate for printing an organic EL ink.

In addition, there are a flexo printing method which uses a rubber plate and a resin relief plate method which uses a resinous plate as a relief printing method which uses a relief printing plate having elasticity. Among them, a method which uses a water developable resin relief plate can be used for printing an organic layer ink, because the method has high tolerance to toluene, xylene and other organic solvents.

According to the above mentioned reasons, a relief printing method which uses a water-developable resin relief plate is the most appropriate as a method of printing an organic layer material ink having an aromatic solvent such as toluene or xylene on a hard base material such as a glass base material.

As a water developable photo sensitive resin which forms a resin relief plate of the present invention, for example, a hydrophilic polymer, a cross-linking monomer such as a monomer including an unsaturated bond, and a type having a photopolymerization initiator as a constituent can be exemplified. For these types, polyamide, polyvinyl alcohol, cellulose derivative or the like can be used as a hydrophilic polymer. As a cross-linking monomer, for example, a methacrylate type which has vinyl bonding can be exemplified. As a photopolymerization initiator, for example, an aromatic carbonyl compound can be exemplified. Among the above, a water developable photo sensitive resin of polyamide series is preferable in terms of a printing adequacy.

Figure 5:
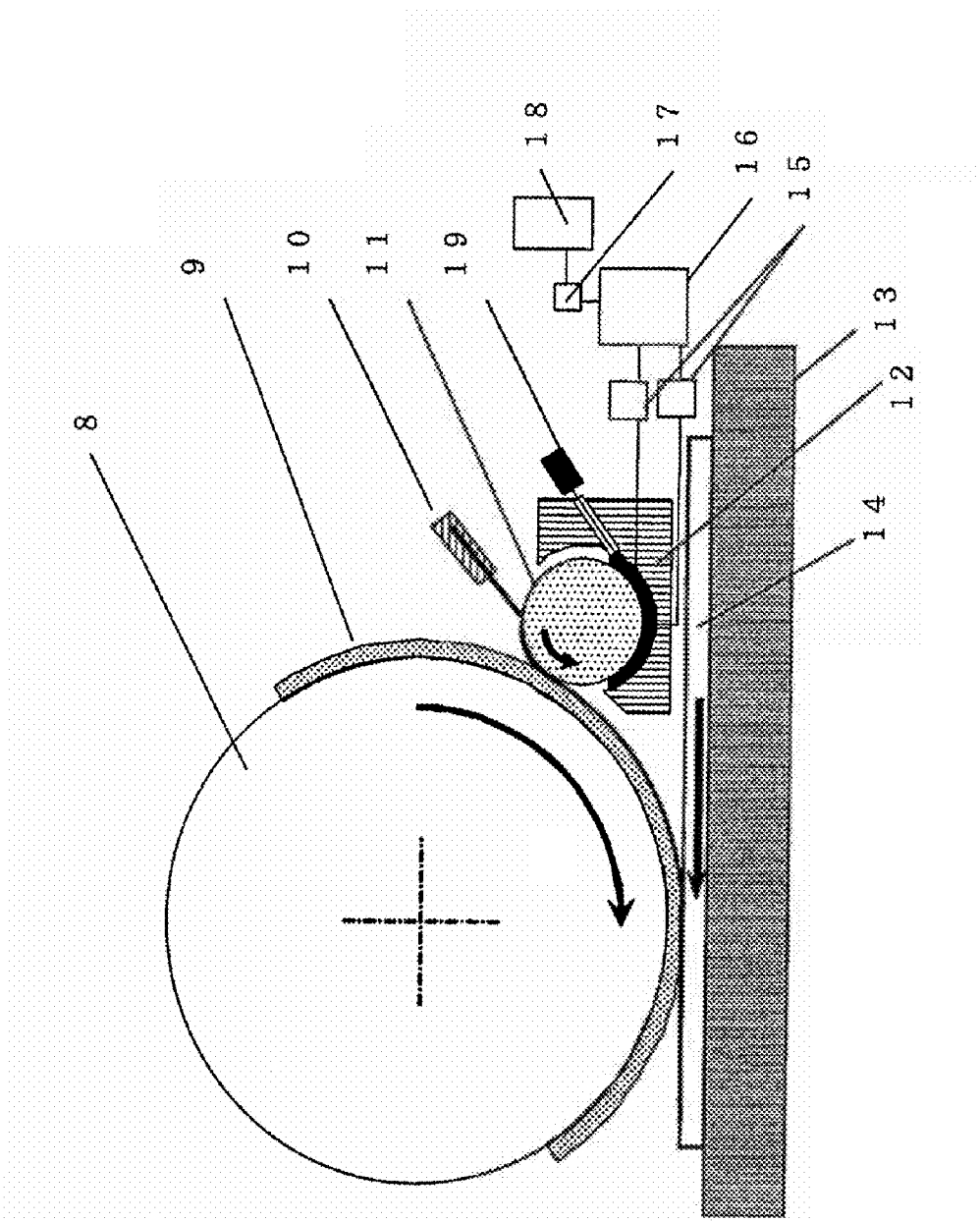
FIG. 5 is a pattern diagram of a printing apparatus of the present invention. 1 . . . a substrate, 2 . . . a partition wall, 3 . . . a pixel electrode, 4 . . . a hole transport layer, 5 . . . a luminescent layer, 6 . . . an interlayer, 8 . . . a plate cylinder, 9 . . . a printing plate, 10 . . . a doctor, 11 . . . an anilox roll, 12 . . . an ink chamber, 13 . . . a substrate, 14 . . . a stage, 15 ... an ink circulation pump, 16 ... an ink tank, 17 ... a solvent instillation apparatus, 18 ... a solvent tank

As a printing machine for forming an organic layer, a relief printing machine which performs a method of printing on a flat plate can be used. However, a printing machine described below is preferable. FIG. 5 shows a schematic view of a printing mechanism. The present manufacturing apparatus has an ink tank 16, an ink chamber 12, an anilox roll 11 and a plate cylinder 8 on which a resin relief plate is arranged. The ink tank 16 has an interlayer material ink or an organic luminescent ink which is diluted with a solvent. An interlayer material ink or an organic luminescent ink can be sent into the ink chamber 12 from the ink tank 16. The anilox roll 11 makes contact with an ink supply section of the ink chamber 12 and the plate cylinder 8, and it is rotatably supported.

Along with a rotation of the anilox roll 11, after an ink sent from the ink chamber is retained on a surface of the anilox roll, the ink is transferred to a convex part of a resin relief plate which is arranged on a plate cylinder so as to form a film with a uniform thickness. Furthermore, a substrate to be printed is fixed to a slidable substrate fixing base and moved to a printing start position, while a position adjustment is performed by a position adjustment mechanism of the plate pattern and substrate pattern. The substrate is then moved according to the rotation of the plate cylinder, while a convex part of a plate has contact with the substrate, and the ink is transferred by patterning onto the predetermined positions of the substrate.

In the case of an organic layer which is formed without a separate formation of different colors such as an interlayer, a pattern can be formed in one go by printing with a relief printing plate which has a convex part of a stripe line with a pitch which is the same as the pitch W1 on a long side direction.

In the case of a luminescent layer, as long as RGB lines of sub pixels are straight stripe lines, the luminescent layer can be printed into a stripe shape when the luminescent layer is formed by a printing method so as to form different colors separately. In other words, although respective sub pixels of a TFT substrate are sectioned into a grid shape by a partition wall, the luminescent layer can be formed by printing continuous lines of a stripe shape on respective rows of sub pixels. In this case, it is necessary to print the luminescent layer three times in order to form three colors, because RGB is printed one color at a time. When a RGB full colored display is manufactured, there are respective sub pixels of RGB and therefore a pitch of a stripe line in the case of printing RGB one color at a time is the same as a pitch P3 of one pixel.

The above mentioned organic layer and the above mentioned luminescent layer can be printed using the same plate material and the same printing machine. However, as shown in FIG. 3, although a luminescent layer is printed in a long side direction of a sub pixel, an organic layer such as an interlayer is printed so as to be perpendicular to the sub pixel (a short side direction). Therefore, in this case, the above is made possible by arranging a printing direction so that a substrate on which an organic layer is formed is turned at an angle of 90° to an installation direction of a substrate on which the luminescent layer is formed.

In the present invention, by forming and printing an organic layer, particularly an interlayer, formed under a luminescent layer in a predetermined direction of a sub pixel, the film thickness of the organic layer can be uniform. Therefore, irregularity in light-emitting is decreased, because the film thickness of the luminescent layer can be stable. Moreover the organic layer can be printed in one go with a plurality of stripe shaped lines by printing the organic layer so as to form a stripe shape in a short side direction of a sub pixel. Therefore, an organic EL display panel which has a higher productivity can be manufactured.

EXAMPLE 1

Examples of the present invention are explained below. In the present example, a TFT substrate on which a pixel electrode, a connection electrode, a TFT circuit, an insulating film made of a SiNx film for protecting the circuit and a partition wall made of polyimide had been formed was used. In addition, the partition wall made of polyimide was formed so as to section pixels. Furthermore, a hole transport layer, an interlayer, a luminescent layer and a cathode were formed in order thereon and an organic EL display panel of an active matrix type was obtained.

A pixel definition of a TFT substrate which was used was 140 ppi. Therefore, a pixel pitch was 181 μm. An apertural part was a rectangular shape having 90 μm in a longitudinal direction by 30 μm in a transverse direction. Here, the longitudinal direction was the same as the direction of a RGB stripe. The transverse direction was perpendicular to a RGB stripe.

A hole transport layer was formed by applying water dispersions of PEDOT/PSS to a TFT substrate by a spin coating method so as to form a thin film with a thickness of 50 nm.

An interlayer was printed and formed by a relief printing method using an ink which has an interlayer material (manufactured by Sumitomo Chemical Co., Ltd) dissolved in xylene, wherein the concentration of the interlayer material was 1%. A resin relief plate which was used in this case was proofed so that a convex part of the plate was formed in a stripe shape and a line of the convex part had a pitch of 181 μm and width of 70 μm. Using this plate, an interlayer was printed so as to form a stripe which is perpendicular to a stripe of an RGB pixel of a TFT substrate. The interlayer was printed on all pixels in one go with only one printing, because printing was performed as described above.

A luminescent layer was printed by a relief printing method using organic luminescent inks of three colors, RGB in which R material, G material and B material of polyfluorene series of an organic luminescence material were dissolved in xylene, where the concentration of each material in its solution was 1.5%. A convex part of a resin relief plate used for printing the luminescent layer was formed into a stripe shape and a line of the convex part had a pitch of 181 μm and width of 30 μm. In addition, by using this plate, respective colors were printed parallel to RGB stripes on respective sub pixels of RGB. At this time, printing was performed three times to form the respective colors.

A cathode layer including Ca and Al was vacuum-deposited and formed thereon by a resistance heating evaporation method. Lastly, these organic EL formatios were sealed by a glass cap and an adhesive in order to protect against external oxygen and moisture. Then, an element panel for an organic EL display could be obtained.

There were connection electrodes on both an anode side and a cathode side which were connected to respective pixel electrodes around an edge of a display area of the obtained panel. A lighted display of the panel was confirmed by connecting these connection electrodes to a driving apparatus through a driver. Thereafter, a luminescent state was examined.

In ten panels obtained by printing the interlayer in one go as mentioned above, a film thickness distribution of the interlayer and emission irregularity were observed. The film thickness distribution of the interlayer was uniform and the luminescent state was also uniform in the panels.

EXAMPLE 2

In Example 2, a TFT substrate had a pixel definition of 200 ppi, a pixel pitch of 127 μm and an apertural part of RGB sub pixels sectioned by a partition wall. In addition, the apertural part was a rectangular shape having 63 μm in a longitudinal direction by 21 μm in a transverse direction. A resin relief plate which was used for printing an interlayer was proofed so that a convex part was formed in a stripe shape and the line of the convex part had a pitch of 127 μm and a width of 50 μm. Next, printing was performed so that a stripe of an interlayer was formed to be perpendicular to a stripe direction of RGB pixel of the TFT substrate. The interlayer was printed on all pixels in one go with only one printing in Example 2 as well as Example 1, because printing was performed as described above.

A resin relief plate which was used for printing a luminescent layer was proofed so that a convex part was formed in a stripe shape and the line of the convex part had a pitch of 127 μm and width of 20 μm. Next, by using this plate, respective colors were printed parallel to RGB stripes on respective sub pixels of RGB. At this time, printing was performed three times to form the respective colors.

Thereafter, the process of manufacturing an organic EL display panel was performed by the same method as shown in Example 1. In ten panels obtained by printing the interlayer in one go as mentioned above, a film thickness distribution of the interlayer and emission irregularity were observed in Example 2. The film thickness distribution of the interlayer was uniform and a luminescent state was also uniform in the panels.

EXAMPLE 3

In Example 3, a TFT substrate had a pixel definition of 70 ppi, a pixel pitch of 362 μm and an apertural part of RGB sub pixels sectioned by a partition wall. In addition, the apertural part was a rectangular shape having 180 μm in a longitudinal direction by 60 μm in a transverse direction. A resin relief plate which was used for printing an interlayer was proofed so that a convex part was formed in a stripe shape and the line of the convex part had a pitch of 362 μm and a width of 140 μm. Next, printing was performed so that a stripe of an interlayer was formed to be perpendicular to a stripe direction of RGB pixel of the TFT substrate. The interlayer was printed on all pixels in one go with only one printing in Example 3 as well as Examples 1 and 2, because printing was performed as described above.

A resin relief plate which was used for printing a luminescent layer was proofed so that a convex part of the plate was formed in a stripe shape and a line of the convex part had a pitch of 362 μm and width of 60 μm. Next, by using this plate, respective colors were printed parallel to RGB stripes on respective sub pixels of RGB. At this time, printing was performed three times to form the respective colors. Thereafter, the process of manufacturing an organic EL display panel was performed by the same method as shown in Example 1.

In ten panels obtained by printing the interlayer in one go as mentioned above, a film thickness distribution of the interlayer and emission irregularity were observed in Example 3. The film thickness distribution of the interlayer was uniform and a luminescent state was also uniform in the panels.

COMPARATIVE EXAMPLE 1

In Comparative Example 1, a TFT substrate had a pixel definition of 70 ppi, a pixel pitch of 362 μm and an apertural part of RGB sub pixels sectioned by a partition wall. In addition, the apertural part was a rectangular shape having 180 μm in a longitudinal direction by 60 μm in a transverse direction. A resin relief plate which was used for printing an interlayer was proofed so that a convex part was formed in a stripe shape and a line of the convex part had a pitch of 121 μm and a width of 60 μm. Next, printing was performed so that a stripe of an interlayer was formed parallel to a stripe direction of RGB pixel of the TFT substrate. In Comparative Example 1, the interlayer was printed on all pixels in one go by printing parallel to a stripe shape of RGB sub pixels with only one printing in this way.

A resin relief plate which was used for printing a luminescent layer was proofed so that a convex part of the plate was formed in a stripe shape and a line of the convex part had a pitch of 362 μm and width of 60 μm. Next, by using this plate, respective colors were printed parallel to RGB stripes on respective sub pixels of RGB. At this time, printing was performed three times to form the respective colors. Thereafter, the process of manufacturing an organic EL display panel was performed by the same method as shown in Example 1.

In ten panels obtained by printing the interlayer in one go on a parallel with RGB stripes, a film thickness distribution of the interlayer and emission irregularity were observed. The film thickness distribution of the interlayer was not uniform and a luminescent state was also not uniform in the panels, compared to Examples 1, 2 and 3.

COMPARATIVE EXAMPLE 2

In Comparative Example 2, a TFT substrate had pixel definition of 220 ppi, pixel pitch of 115 μm and an apertural part of RGB sub pixels sectioned by a partition wall. In addition, the apertural part was a rectangular shape having 57 μm in a longitudinal direction by 19 μm in a transverse direction. A resin relief plate which was used for printing an interlayer was proofed so that a convex part was formed in a stripe shape and a line of the convex part had a pitch of 60 μm and a width of 30 μm. Next, printing was performed so that a stripe of an interlayer was formed parallel to a stripe direction of RGB pixel of the TFT substrate.

In Comparative Example 2, the interlayer was printed in parallel with a stripe shape of RGB sub pixels and the interlayer was formed on all pixels in one go with only one printing in this way. However, there was a lot of ink which entered into the concave portion, because a width of the concave portion of the relief printing plate was 30.4 µm, which was narrow. Therefore, a normal stripe line could not be formed. Then, production of a panel was discontinued.

REFERENCE EXAMPLE

In the Reference Example, a TFT substrate had pixel definition of 220 ppi, pixel pitch of 115 µm and an apertural part of RGB sub pixels sectioned by a partition wall. In addition, the apertural part was a rectangular shape having 57 µm in a longitudinal direction by 19 µm in a transverse direction. A resin relief plate which was used for printing an interlayer was proofed so that a convex part was formed in a stripe shape and a line of the convex part had a pitch of 115 µm and a width of 45 µm. Next, printing was performed so that a stripe of an interlayer was formed perpendicular to a stripe direction of RGB pixel of the TFT substrate. In the Reference Example, the interlayer was printed so as to be perpendicular to a stripe shape of RGB sub pixels and the interlayer was formed on all pixels in one go with only one printing in this way.

A resin relief plate which was used for printing a luminescent layer was proofed so that a convex part of the plate was formed in a stripe shape and a line of the convex part had a pitch of 115 µm and width of 19 µm. Next, by using this plate, respective colors were printed perpendicular to RGB stripes on respective sub pixels of RGB. At this time, printing was performed three times to form the respective colors. Thereafter, the process of manufacturing an organic EL display panel was performed by the same method as shown in Example 1.

In ten panels obtained by printing the interlayer in one go so as to be perpendicular to RGB stripes, a film thickness distribution of the interlayer and emission irregularity were observed. The film thickness distribution of the interlayer was not uniform and a luminescent state was also not uniform in the panels, compared to Examples 1, 2 and 3.

Table 1 shows the results of evaluating the film thicknesses distributions within the panels and the luminescent states of the organic EL display panels of the examples 1-3, comparative examples 1 and 2 and reference example.

As shown in Table 1, both the film thickness distributions and the luminescent states were excellent in Examples 1, 2 and 3. According to this, it was found that an interlayer could be printed in one go using a panel with a definition of 70~200 ppi, because the interlayer could be printed with a pitch which is the same as a pixel pitch by printing the interlayer to be perpendicular to the pixel stripe.

On the other hand, in Comparative Example 1, both the film thickness distribution and the luminescent state were not applicable. According to this, even if a definition was 70 ppi, in order to print the interlayer in parallel with pixel stripes on all pixels in one go, printing with a pitch of one third of the pixel pitch was required. Therefore, it was found that the interlayer was defective.

In Comparative Example 2, printing itself could not be performed. This was because in order to print the interlayer on all pixels in one go in parallel with pixel stripes using a panel with 140 ppi, a pitch of one third of a pitch of 140 ppi was required.

In the Reference Example, both the film thickness distribution and the luminescent state were not applicable as well as Comparative Example 1. This was because even if the interlayer was printed with a pitch which was the same as the pixel pitch by printing the interlayer to be perpendicular to the pixel stripe, defects occurs at the time of printing due to narrowness of the pixel pitch itself with a definition of 220 ppi.

| | A definition of a display | A method of printing an interlayer | A line pattern of a convex part of a printing plate | A film thickness distribution of an interlayer | A luminescent state of a panel |
|---|---|---|---|---|---|
| Example 1 | 140 ppi | A transverse direction: all pixels are formed in one go | Pitch: 181 µm Width: 70 µm | ◯ | ◯ |
| Example 2 | 200 ppi | A transverse direction: all pixels are formed in one go | Pitch: 127 µm Width: 50 µm | ◯ | ◯ |
| Example 3 | 70 ppi | A transverse direction: all pixels are formed in one go | Pitch: 362 µm Width: 140 µm | ◯ | ◯ |
| Comparative Example 1 | 70 ppi | A longitudinal direction: all pixels are formed in one go | Pitch: 121 µm Width: 60 µm | X | X |
| Comparative Example 2 | 140 ppi | A longitudinal direction: all pixels are formed in one go | Pitch: 60 µm Width: 30 µm | Printing could not be performed | — |
| Reference Example | 220 ppi | A longitudinal direction: all pixels are formed in one go | Pitch: 115 µm Width: 45 µm | X | X |

A film thickness distribution: ◯: uniform, X: nonuniform
A luminescent state: ◯: excellent, X: inapplicable
A transverse direction is a direction which is perpendicular to a RGB stripe direction.
A longitudinal direction is a direction which is in parallel with a RGB stripe direction.

What is claimed is:

1. A method for manufacturing an organic EL display panel, the method comprising:
   preparing a substrate which has a pixel electrode, a partition wall, a sub pixel having a short side and a long side sectioned by said partition wall and a pixel having a plurality of said sub pixels;
   forming a first organic layer of a stripe shape in a short side direction of said sub pixel by printing; and
   forming a second organic layer which is a luminescent layer on said sub pixel.

2. The method for manufacturing an organic EL display panel according to claim 1, wherein a hole transport layer is on said pixel electrode, and said first organic layer is an interlayer formed between said hole transport layer and an organic luminescent layer.

3. The method for manufacturing an organic EL display panel according to claim 1, wherein said first organic layer is printed in a plurality of stripe shaped lines corresponding to a pitch in said long side direction of said sub pixel.

4. The method for manufacturing an organic EL display panel according to claim 1, wherein said first organic layer is printed on all pixels in one go.

5. The method for manufacturing an organic EL display panel according to claim 1, wherein said second organic layer is formed and printed in a stripe shape in said long side direction of said sub pixel.

6. The method for manufacturing an organic EL display panel according to claim 1, wherein said first organic layer is formed by transferring an ink to said substrate by a relief plate which has a plurality of stripe shaped convex parts.

7. The method for manufacturing an organic EL display panel according to claim 6, wherein a pitch of said plurality of stripe shaped convex parts corresponds to a pitch in said long side direction of said sub pixel.

* * * * *